(12) United States Patent
Ono (10) Patent No.: US 6,774,481 B2
(45) Date of Patent: Aug. 10, 2004

(54) SOLID-STATE IMAGE PICKUP DEVICE (75) Inventor: Koji Ono, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/938,571

(22) Filed: Aug. 27, 2001

(65) Prior Publication Data

US 2002/0027284 A1 Mar. 7, 2002

(30) Foreign Application Priority Data

Aug. 28, 2000 (JP) .......................... 2000-257545

(51) Int. Cl.[7] .............................................. H01L 23/12
(52) U.S. Cl. ...................... 257/704; 257/686; 257/704; 257/709; 257/787; 257/788; 257/790; 257/792; 257/793; 257/794
(58) Field of Search ................................ 257/686, 704, 257/709, 787, 788, 790, 792, 793, 794

(56) References Cited

U.S. PATENT DOCUMENTS

| | | | | |
|---|---|---|---|---|
| 5,042,919 A | * | 8/1991 | Yabu et al. ............... | 359/88 |
| 5,138,145 A | * | 8/1992 | Nakmura et al. ........ | 250/208.1 |
| 5,506,401 A | | 4/1996 | Segawa et al. ........... | 250/208.1 |
| 5,786,589 A | * | 7/1998 | Segawa et al. ........... | 250/208.1 |
| 5,867,368 A | * | 2/1999 | Glenn ..................... | 361/783 |
| 6,204,454 B1 | * | 3/2001 | Gotoh et al. ............. | 174/255 |
| 6,262,513 B1 | * | 7/2001 | Furukawa et al. ........ | 310/313 |
| 6,396,116 B1 | * | 5/2002 | Kelly et al. .............. | 257/432 |

FOREIGN PATENT DOCUMENTS

| | | | | |
|---|---|---|---|---|
| JP | 08-241976 | * | 9/1996 | ............. 257/704 |

* cited by examiner

*Primary Examiner*—Tom Thomas
*Assistant Examiner*—Edgardo Ortiz
(74) *Attorney, Agent, or Firm*—Fitzpatrick, Cella, Harper & Scinto (57) ABSTRACT

A solid-state image pickup device in which no warp occurs in a solid-state image pickup element chip is provided. A solid-state image pickup device, including a solid-state image pickup element chip on which a plurality of solid-state image pickup elements are mounted, a wiring substrate electrically connected to the solid-state image pickup element chip and adapted to transmit signals from each one of a plurality of solid-state image pickup elements, and a protection cap provided on a light incident side of the solid-state image pickup element chip and adapted to protect the solid-state image pickup element chip, is characterized in that the solid-state image pickup element chip is formed on a substrate with a thermal expansion coefficient equal to that of the protection cap, and the substrate and the protection cap are sealed with a sealing resin.

13 Claims, 6 Drawing Sheets

SOLID-STATE IMAGE PICKUP DEVICE

BACKGROUND OF THE INVENTION

FIELD OF THE INVENTION

The present invention relates to a solid-state image pickup device such as a CCD or CMOS image sensor used in a digital camera or the like.

Conventionally, a solid-state image pickup device such as a CCD or CMOS image sensor is utilized in a digital camera or the like and its application field expands. As the product becomes more downsized and lower-profile, a solid-state image pickup device which is more downsized and lower-profile is strongly demanded. In order to meet this demand, a solid-state image pickup device using a TAB (Tape-Automated Bonding) tape as described in, e.g., U.S. Pat. No. 5,506,401, is available.

Figure 7:
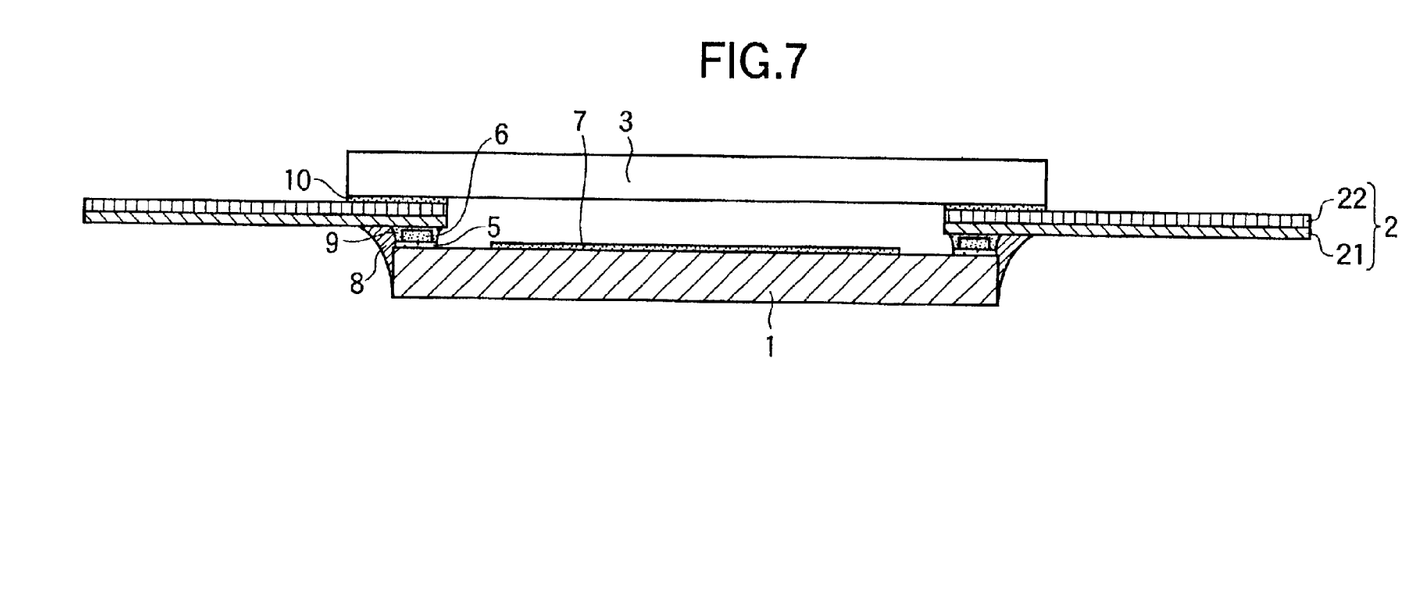
FIG. 7 is a sectional view of a conventional solid-state image pickup device.

FIG. 7 is a sectional view of a solid-state image pickup device described in the above reference. As shown in FIG. 7, in a conventional solid-state image pickup device, a TAB tape 2 with an insulating film 22 and copper leads 21 is adhered to one surface of a protection cap 3 with an adhesive 10.

The TAB tape 2 is connected onto bumps 6 formed on electrode pads 5 of a solid-state image element pickup chip 1, on which a plurality of solid-state image pickup elements 7 are mounted, through an anisotropic conductive film 9. Alternatively, the TAB tape 2 may be connected to the bumps 6 directly by ultrasonic bonding.

The solid-state image pickup element chip 1 and protection cap 3 are sealed at their peripheries with a sealing resin 8. The solid-state image pickup device using such a TAB tape 2 can be formed more downsized and lower-profile than, e.g., a wire-bonded ceramic package.

According to the conventional technique, however, since the thermal expansion coefficient of the solid-state image pickup element chip differ from that of the protection cap, the heating in the manufacturing process or changes in temperature during use warps the solid-state image pickup element chip. Among countermeasures to prevent this, a protection cap with a thermal expansion coefficient comparatively close to that of silicon as the main material of the solid-state image pickup element chip may be used.

However, because of the cost and other characteristic aspects, a protection cap with a thermal expansion coefficient largely different from that of silicon must often be used. Therefore, another solution has been sought for.

When the protection cap and solid-state image pickup element chip are sealed at their peripheries by heating, air between the protection cap and solid-state image pickup element chip expands by heating and escapes from the sealed structure. If encapsulation is completed in this state, air in the sealed structure that has been restored to room temperature shrinks, and a warp occurs in the solid-state image pickup element chip. As a countermeasure for this, a portion free from the sealing resin is reserved in advance so a vent hole is formed there after adhesion, and this portion is closed later on and encapsulation is completed. In this case, however, the process increases, leading to an increase in cost.

Shrinkage of the sealing resin itself during hardening also warps the solid-state image pickup element chip. When a warp occurs in the solid-state image pickup element chip in the above manner, the focal point differs among the pixels of the solid-state image pickup elements, and the image quality degrades.

SUMMARY OF THE INVENTION

It is, therefore, an object of the present invention to provide a solid-state image pickup device in which a warp does not occur in the solid-state image pickup element chip.

In order to achieve the above object, according to the present invention, there is provided a solid-state image pickup device comprising a solid-state image pickup element chip on which a plurality of solid-state image pickup elements are mounted, and a protection cap provided on a light incident side of the solid-state image pickup element chip and adapted to protect the solid-state image pickup element chip, characterized in that the solid-state image pickup element chip is formed on a substrate with a thermal expansion coefficient equal to that of the protection cap, and the substrate and the protection cap are sealed with a sealing resin.

According to the present invention, there is also provided a solid-state image pickup device comprising a solid-state image pickup element chip on which a plurality of solid-state image pickup elements are mounted, and a protection cap provided on a light incident side of the solid-state image pickup element chip and adapted to protect the solid-state image pickup element chip, characterized in that the solid-state image pickup element chip is formed on a substrate made of the same material as that of the protection cap through a light-shielding layer that shields light, and the substrate and the protection cap are sealed with a sealing resin.

More specifically, according to the present invention, the protection cap and solid-state image pickup element chip with different thermal expansion coefficients are not directly adhered to each other, so no warp is caused in the solid-state image pickup element chip by an ambient temperature change.

According to the present invention, the solid-state image pickup element chip is sealed between the protection cap and substrate, and is not fixed to the protection cap. Thus, even when the atmospheric pressure in the sealed structure changes or the sealing resin shrinks during hardening, no warp occurs in the solid-state image pickup elements.

DESCRIPTION OF THE PREFERRED EMBODIMENTS

The preferred embodiments of the present invention will be described in detail with reference to the accompanying drawings.

First Embodiment

Figure 1:
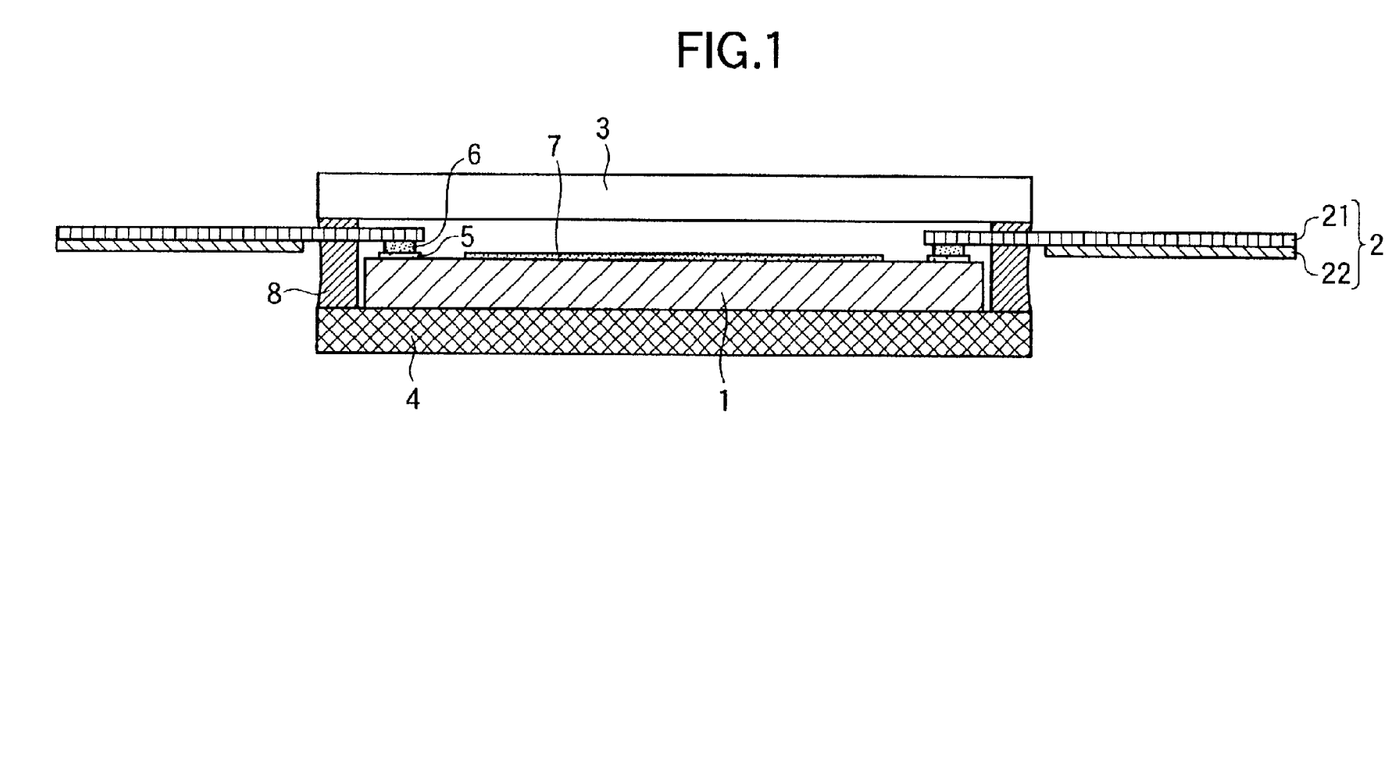
FIG. 1 is a sectional view of a solid-state image pickup device according to the first embodiment of the present invention.
Figure 2:
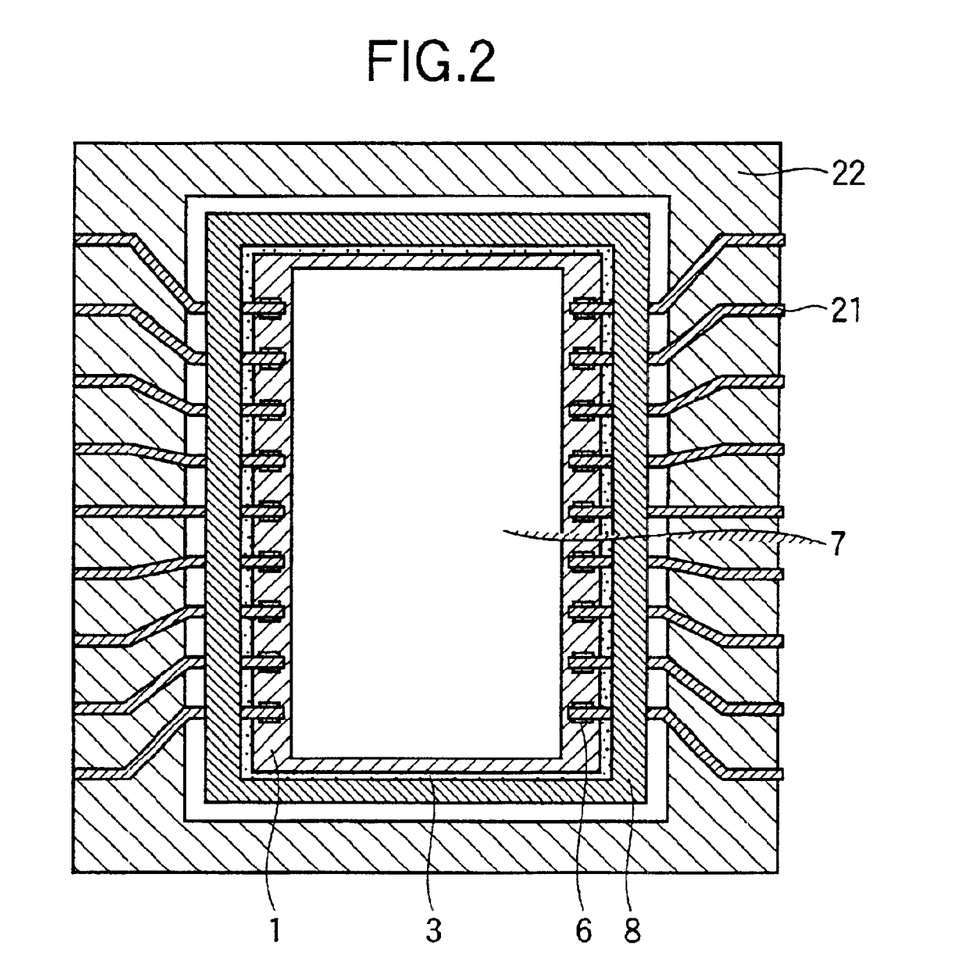
FIG. 2 is a plan view of FIG. 1.
Figure 3:
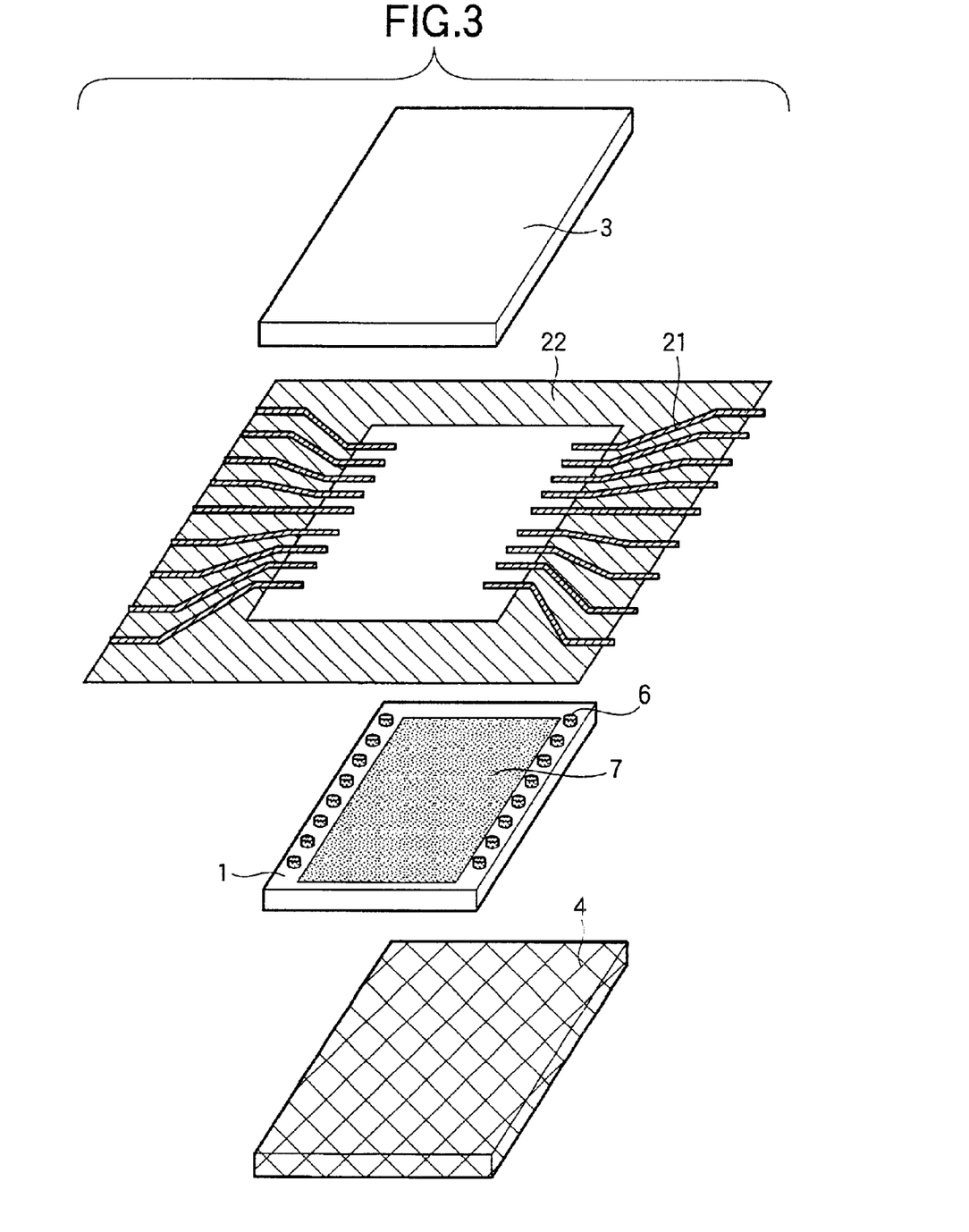
FIG. 3 is an exploded perspective view of FIG. 1.

FIG. 1 is a sectional view of a solid-state image pickup device according to the first embodiment of the present invention. FIG. 2 is a plan view of FIG. 1. FIG. 3 is an exploded perspective view of FIG. 1. FIG. 1 shows a state wherein a TAB tape 2 is connected to bumps 6 formed on electrode pads 5 of a solid-state image pickup element chip 1. The TAB tape 2 can be connected, e.g., by ultrasonic bonding or through an anisotropic conductive film or conductive paste.

To form the bumps 6, gold is usually used. Alternatively, the bumps 6 may be formed of another metal such as copper or nickel, or an alloy, and be plated with gold. In the TAB tape 2, a plurality of copper leads 21 are formed on an insulating film 22. The insulating film 22 is formed of a resin film such as a polyimide film.

A protection cap 3 is arranged on a light incident side of the solid-state image pickup element chip 1, and a substrate 4 is arranged on the lower surface of the solid-state image pickup element chip 1, such that they sandwich the solid-state image pickup element chip 1. The protection cap 3 is made of, e.g., non-alkali glass or quartz, and transmits light through it. Alternatively, a protection cap made of a resin having light transmission properties, e.g., an acrylic resin, may be used. An optical low-pass filter or infrared cutting filter may be formed on the protection cap 3.

Usually, a light-shielding film is formed on the periphery of the protection cap 3 so as to cover the bumps 6 and copper leads 21, so they will not cause diffused reflection of the incident light that adversely affects the image.

The substrate 4 has a thermal expansion coefficient equal to that of the protection cap 3, and is formed of, e.g., a glass substrate, ceramic substrate, metal substrate, or resin substrate, or by stacking them.

The protection cap 3 and substrate 4 are sealed at their peripheries with a sealing resin 8 to hermetically seal the solid-state image pickup element chip 1. For example, the sealing resin 8 is an epoxy-, acrylic, or phenol-based resin, and can be of either thermoset, ultraviolet-curing, or ultraviolet-curing/thermoset type. A filler may be mixed in the sealing resin 8 to improve the reliability. The filler may be either an inorganic or organic material, and is made of, e.g., silica.

According to this embodiment, since the protection cap 3 is adhered to the substrate 4 with a thermal expansion coefficient equal to that of the protection cap 3, a force that warps the solid-state image pickup element chip 1 is not substantially generated by an ambient temperature change. Since the solid-state image pickup element chip 1 is not directly influenced by a change in atmospheric pressure in the sealed structure or by shrinkage of the sealing resin 8 during hardening, a warp in the solid-state image pickup element chip 1 can be suppressed.

Second Embodiment

Figure 4:
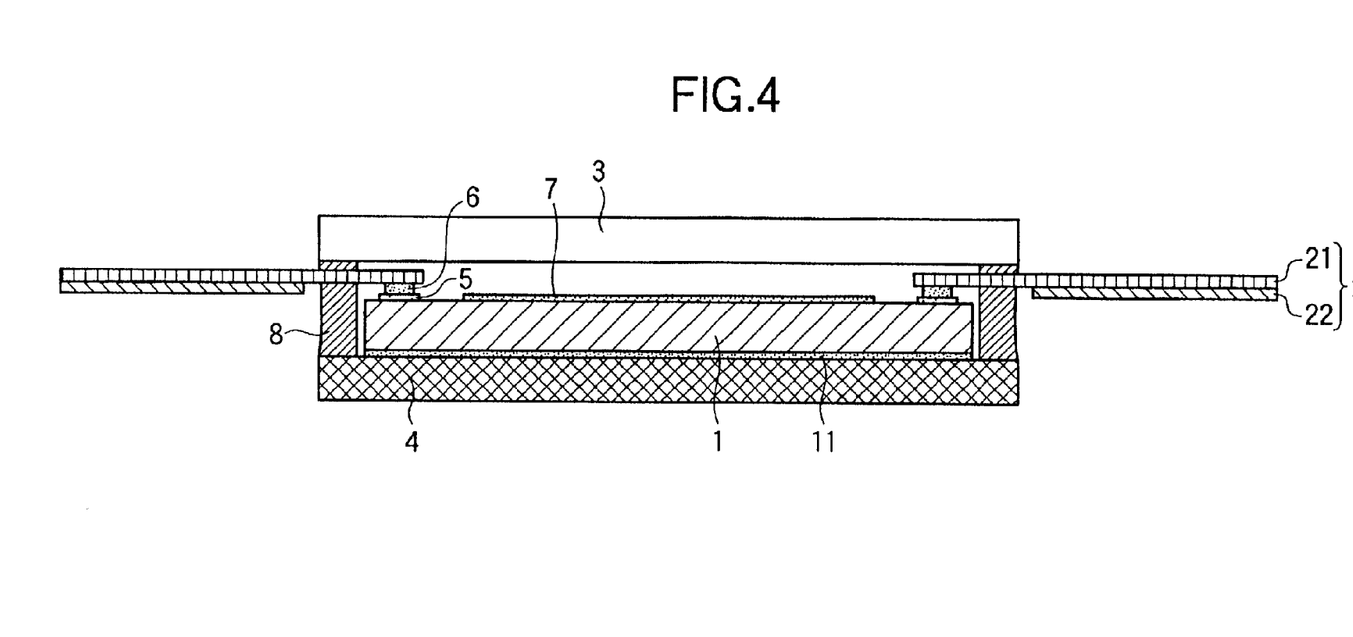
FIG. 4 is a sectional view of a solid-state image pickup device according to the second embodiment of the present invention.

FIG. 4 is a sectional view of a solid-state image pickup device according to the second embodiment of the present invention. In FIG. 4, portions that are identical to those of FIG. 1 are denoted by the same reference numerals as in FIG. 1. FIG. 4 shows a state wherein a solid-state image pickup element chip 1 is fixed to a substrate 4 with a flexible adhesive 11.

For example, the adhesive 11 is made of an urethane-, silicone-, styrene-, ester-, vinyl chloride-, or epoxy-based resin, and preferably has a modulus of elasticity of 1,000 MPa or less. In this embodiment, the solid-state image pickup element chip 1 is fixed to a predetermined position of the substrate 4, so positioning which is necessary when attaching the solid-state image pickup device to a camera becomes easy. Also, since the adhesive 11 that fixes the solid-state image pickup element chip 1 has flexibility, it does not cause a warp in the solid-state image pickup element chip 1.

Third Embodiment

Figure 5:
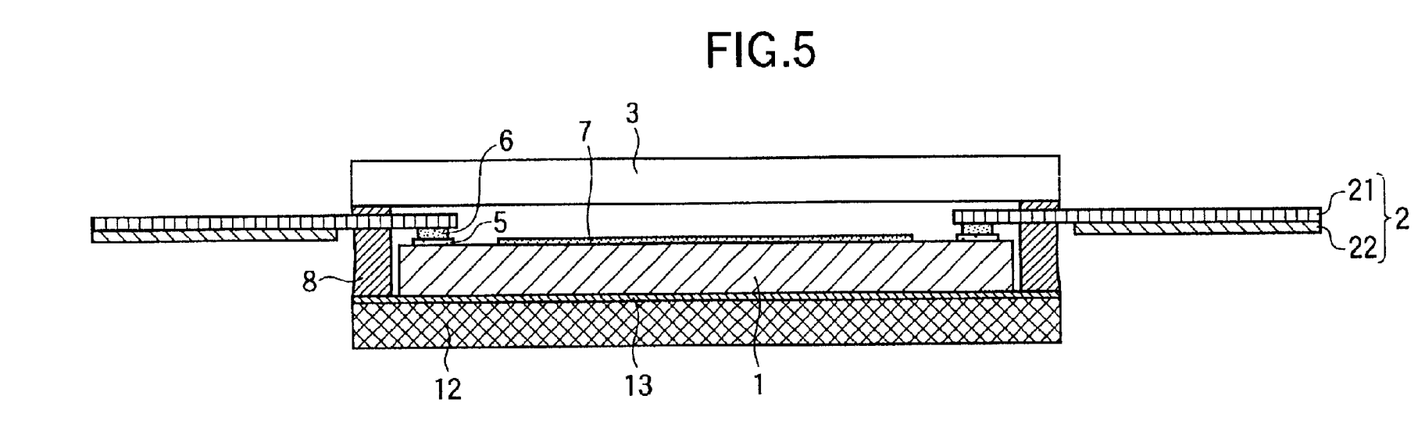
FIG. 5 is a sectional view of a solid-state image pickup device according to the third embodiment of the present invention.

FIG. 5 is a sectional view of a solid-state image pickup device according to the third embodiment of the present invention. In FIG. 5, portions that are identical to those of FIG. 1 are denoted by the same reference numerals as in FIG. 1. In FIG. 5, a glass substrate 12 made of the same material as that of a protection cap 3 is used. The glass substrate 12 has light transmission properties. Hence, a light-shielding film 13 is formed on the inner surface of the glass substrate 12 so unwanted light will not enter from the lower surface of the solid-state image pickup device.

The light-shielding film 13 is formed on the entire surface or only the periphery of the glass substrate 12 to surround a solid-state image pickup element chip 1. In this embodiment, since the protection cap 3 and glass substrate 12 are made of the same material, no warp is caused in the solid-state image pickup element chip 1 by a difference in thermal expansion coefficient. Since the light-shielding film 13 is formed on the glass substrate 12, incident light from the lower surface of the solid-state image pickup device can be prevented.

The light-shielding film 13, the glass substrate 12, and the solid-state image pickup element chip 1 may be adhered to each other with an adhesive 11. Alternatively, a flexible adhesive that can shield light may be used as the light-shielding film 13, and the glass substrate 12 and solid-state image pickup element chip 1 may be adhered to each other through the light-shielding adhesive. Alternatively, the light-shielding film 13 may be formed on the solid-state image pickup device shown in FIG. 4.

Fourth Embodiment

Figure 6:
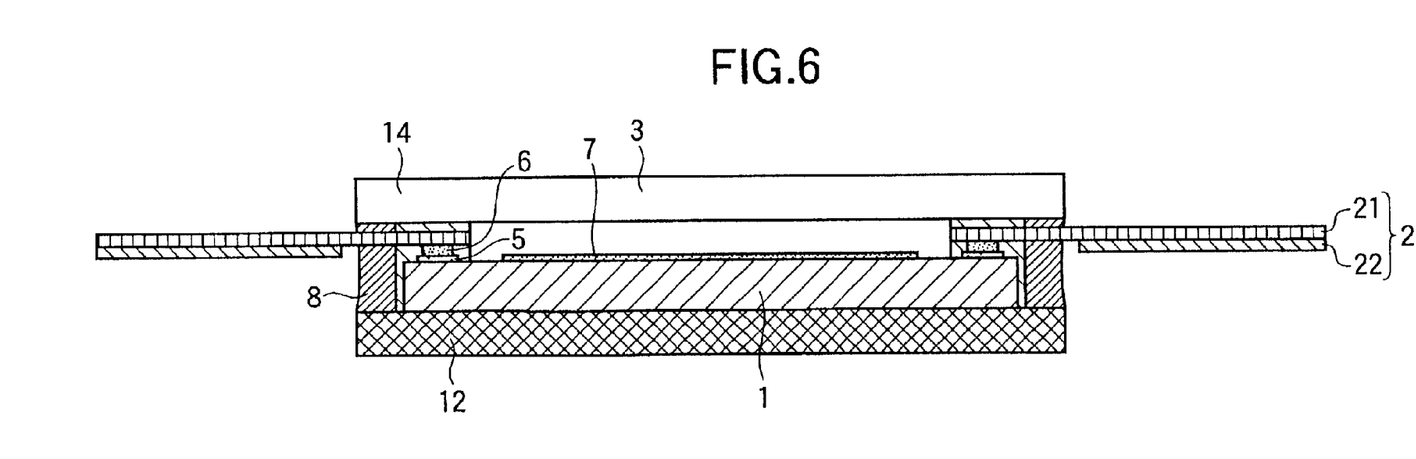
FIG. 6 is a sectional view of a solid-state image pickup device according to the fourth embodiment of the present invention.

FIG. 6 is a sectional view of a solid-state image pickup device according to the fourth embodiment of the present invention. In FIG. 6, portions that are identical to those of FIG. 1 are denoted by the same reference numerals as in FIG. 1. In FIG. 6, a contact preventive member 14 is formed around a solid-state image pickup element chip 1 from a flexible resin.

For example, the contact preventive member 14 is formed by thermally bonding a thermoset resin, applied to a protection cap 3 in advance and rendered B-stage, to the solid-state image pickup element chip 1 and a substrate 4. The thermoset resin is rendered B-stage in order to prevent it from spreading to a light-receiving surface 7 during thermal bonding. In place of a thermoset resin, a thermoplastic resin may be used.

For example, the contact preventive member 14 is made of a flexible resin such as an urethane-, silicone-, styrene-, ester-, vinyl chloride-, epoxy-, or phenol-based resin, and preferably has a modulus of elasticity of 1,000 MPa or less. In this embodiment, the contact preventive member 14 is adhered to the periphery of the solid-state image pickup element chip 1. Alternatively, the contact preventive member 14 may be formed outside the solid-state image pickup element chip 1, and be adhered to only the protection cap 3 and substrate 4.

In this embodiment, since the contact preventive member 14 is formed to surround solid-state image pickup elements 7, a sealing resin 8 does not enter the solid-state image pickup elements 7. Hence, the selection of the material of the sealing resin 8 is widened. Since the contact preventive member 14 is made of a flexible resin, no warp occurs in the solid-state image pickup element chip 1.

As has been described above, according to the present invention, a solid-state image pickup element chip is formed on a substrate with a thermal expansion coefficient equal to that of a protection cap, and the substrate and protection cap are sealed with a sealing resin. Alternatively, a solid-state image pickup element chip is formed on a substrate made of the same material as that of a protection cap through a light-shielding layer that shields light, and the substrate and protection cap are sealed with a sealing resin. Therefore, no warp occurs in the solid-state image pickup element chip.

What is claimed is:

1. A solid-state image pickup device comprising:
   a supporting substrate, provided with no wiring;
   a solid-state image pickup element chip on which a plurality of solid-state image pickup elements are mounted, said solid-state image device pickup element chip being formed on a light incident side of said supporting substrate;
   a protection cap provided on a light incident side of said solid-state image pickup element chip and adapted to protect said solid-state image pickup element chip; and
   a wiring substrate formed of a flexible material and connected electrically to said solid-state image pickup element chip,
   wherein a connection between said solid-state image pickup element chip and said wiring substrate is fixed only at a bump formed on an electrode pad, and
   wherein said supporting substrate has a thermal expansion coefficient substantially equal to that of said protection cap, and said supporting substrate and said protection cap are sealed with a sealing resin, so as to form a structure having a hollow space between said solid-state image pickup element chip and said protection cap.

2. A solid-state image pickup device comprising:
   a supporting substrate, provided with no wiring;
   a solid-state image pickup element chip on which a plurality of solid-state image pickup elements are mounted, said solid-state image device pickup element chip being formed on a light incident side of said supporting substrate;
   a protection cap provided on a light incident side of said solid-state image pickup element chip and adapted to protect said solid-state image pickup element chip; and
   a wiring substrate formed of a flexible material and connected electrically to said solid-state image pickup element chip,
   wherein a connection between said solid-state image pickup element chip and said wiring substrate is fixed only at a bump formed on an electrode pad, and
   wherein said supporting substrate is made of the same material as that of said protection cap, and said supporting substrate and protection cap are sealed with a sealing resin, so as to form a substrate having a hollow space between said solid-state image pickup element chip and said protection cap.

3. The device according to claim 1, wherein on said protection cap, an optical low pass filter or an infrared rays cut filter is formed.

4. The device according to claim 1, wherein at a periphery of said protection cap, a light shielding layer is formed.

5. The device according to claim 1, wherein said solid-state image pickup element chip is adhered onto said supporting substrate, with a flexible adhesive.

6. The device according to claim 1, wherein said supporting substrate, is one of a glass substrate, a ceramic substrate, a metal substrate, a resin substrate, or a substrate formed by stacking two or more of glass, ceramic, metal, and resin substrates.

7. The device according to claim 1, wherein said sealing resin is a resin selected from the group consisting of epoxy, acrylic, and phenol-based resins.

8. The device according to claim 1, further comprising a light-shielding layer, and wherein said solid-state image pickup element chip is formed on said supporting substrate with said light-shielding layer between said supporting substrate and said solid-state image pickup element chip.

9. The device according to claim 2, wherein said solid-state image pickup element chip is adhered onto said supporting substrate, with a flexible adhesive.

10. The device according to claim 2, wherein supporting substrate is one of a glass substrate, a ceramic substrate, a metal substrate, a resin substrate, or a substrate formed by stacking two or more of glass, ceramic, metal, and resin substrates.

11. The device according to claim 2, wherein said sealing resin is a resin selected from the group consisting of epoxy, acrylic, and phenol-based resins.

12. The device according to claim 2, further comprising a light-shielding layer, and wherein said solid-state image pickup element chip is formed on said supporting substrate with said light-shielding layer between said supporting substrate and said solid-state image pickup element chip.

13. The device according to claim 2, wherein said light-shielding layer is formed of a light shielding and flexible adhesive.

* * * * *

UNITED STATES PATENT AND TRADEMARK OFFICE
CERTIFICATE OF CORRECTION

PATENT NO. : 6,774,481 B2
DATED : August 10, 2004
INVENTOR(S) : Koji Ono

It is certified that error appears in the above-identified patent and that said Letters Patent is hereby corrected as shown below:

<u>Title page,</u>
Item [56], References Cited, U.S. PATENT DOCUMENTS,
"5,138,145    8/1992    Nakmura et al." should read
-- 5,138,145    8/1992    Nakamura et al. --.

Signed and Sealed this

Eleventh Day of April, 2006

JON W. DUDAS
*Director of the United States Patent and Trademark Office*